United States Patent
Gamo

(10) Patent No.: US 6,636,130 B2
(45) Date of Patent: Oct. 21, 2003

(54) PIEZOELECTRIC FILTER WITH DIFFERENT RATIOS OF UNPOLARIZED VIBRATION AREA TO TOTAL VIBRATION AREA IN TWO FILTER ELEMENTS

(75) Inventor: Masao Gamo, Takaoka (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 37 days.

(21) Appl. No.: 10/077,785

(22) Filed: Feb. 20, 2002

(65) Prior Publication Data
US 2002/0186102 A1 Dec. 12, 2002

(30) Foreign Application Priority Data
Jun. 6, 2001 (JP) ........................................ 2001-171634

(51) Int. Cl.[7] ................................................ H03H 9/58
(52) U.S. Cl. ........................ 333/187; 333/189; 310/366
(58) Field of Search .................................. 333/186–192; 310/357, 366, 322, 348

(56) References Cited

U.S. PATENT DOCUMENTS 5,670,919 A * 9/1997 Gamo ......................... 333/189
6,002,308 A * 12/1999 Gamo ......................... 333/187

FOREIGN PATENT DOCUMENTS

| JP | 63-92114 | * | 4/1988 | ................. 333/191 |
| JP | 7-95004 | * | 4/1995 | |
| JP | 10-284985 | | 10/1998 | |
| JP | 2002-261584 | * | 9/2002 | |

* cited by examiner

Primary Examiner—Barbara Summons
(74) Attorney, Agent, or Firm—Keating & Bennett, LLP

(57) ABSTRACT

A piezoelectric filter includes first and second dual-mode filter elements connected in a face-to-face arrangement. The first and second filter elements have substantially the same center frequency. Each of the first and second filter elements has a piezoelectric substrate, which has unpolarized sections located at edges thereof. Portions of a vibration region where energy-trapped vibration of each of the first and second filter elements is generated are located in the unpolarized sections. The ratio of the area of the portions of the vibration region which are located in the unpolarized sections of the first filter element to the area of the entire vibration region of the first filter element is different from the ratio of the area of the portions of the vibration region which are located in the unpolarized sections of the second filter element to the area of the entire vibration region of the second filter element.

20 Claims, 6 Drawing Sheets

PIEZOELECTRIC FILTER WITH DIFFERENT RATIOS OF UNPOLARIZED VIBRATION AREA TO TOTAL VIBRATION AREA IN TWO FILTER ELEMENTS

BACKGROUND OF THE INVENTION

1. Field of the Invention

The present invention relates to piezoelectric filters, and more particularly, to a piezoelectric filter in which two dual-mode filter elements are connected to each other in a face-to-face arrangement.

2. Description of the Related Art

In the related art, a piezoelectric filter in which two dual-mode filter elements are connected such that they face each other with a relay capacitance interposed therebetween is used as an intermediate frequency stage filter in mobile communication equipment such as portable telephones. Such a piezoelectric filter is disclosed in, for example, Japanese Unexamined Patent Application Publication No. 10-284985.

The piezoelectric filter has first and second dual-mode filter elements which are stacked and bonded to each other. The first filter element has first and second major surfaces, with split electrodes on the first major surface and a common electrode, which faces the split electrodes, on the second major surface. Further, a capacitance electrode, which also functions as a terminal electrode, is disposed on the first major surface, and a capacitance electrode, which faces the capacitance electrode of the first major surface, is disposed on the second major surface to provide a capacitance portion. The second filter element also has a similar configuration, and one of the split electrodes of the first filter element and one of the split electrodes of the second filter element are interconnected. In addition, ground terminal electrodes of both filter elements are interconnected.

In the piezoelectric filter of the related art, unpolarized sections are provided at edges of the piezoelectric substrate of each filter element, and the terminal electrodes and capacitance electrode are provided within the unpolarized sections. Thus, this arrangement allows undesirable, unwanted vibration to be suppressed, thereby providing good filter characteristics.

In such a piezoelectric filter, however, the energy-trapping states of filter elements are equal. As a result, frequencies at which unwanted vibrations are generated are also the same, so that the unwanted vibrations are superimposed with each other, resulting in greater undesired vibration responses. To reduce such unwanted vibration responses, frequencies of respective filter elements can be displaced from each other. This approach, however, causes degradation in the attenuation characteristic of the piezoelectric filter, and thus is undesirable.

SUMMARY OF THE INVENTION

In order to overcome the problems described above, preferred embodiments of the present invention provide a piezoelectric filter which effectively eliminates unwanted vibration responses by displacing the frequencies of unwanted vibrations, without displacing the center frequencies of two filter elements.

According to a first preferred embodiment of the present invention, a piezoelectric filter includes first and second energy-trapping dual-mode filter elements. The first filter element has a first piezoelectric substrate having first and second major surfaces, split electrodes provided on the first major surface, a common electrode which is provided on the second major surface and which faces the split electrodes, and terminal electrodes provided at or adjacent to edges of both the first and the second major surfaces, each of the terminal electrodes being connected with one of the split electrodes and the common electrode. The second filter element has a second piezoelectric substrate having first and second major surfaces, split electrodes provided on the first major surface, a common electrode which is provided on the second major surface and which faces the split electrodes, and terminal electrodes provided at or adjacent to edges of both the first and the second major surfaces, each of the terminal electrodes being connected with one of the split electrodes and the common electrode. One of the split electrodes of the first filter element is interconnected with one of the split electrodes of the second filter element. Unpolarized sections are provided at edges of each of the first and second piezoelectric substrates, and the first and second filter elements each have a vibration region in which the energy-trapping vibration is generated, portions of each vibration region being located in the unpolarized sections. The ratio of the area of the portions of the vibration region which are located in the unpolarized sections of the first filter element to the area of the entire vibration region of the first filter element is different from the ratio of the area of the portions of the vibration region which are located in the unpolarized sections of the second filter element to the area of the entire vibration region of the second filter element.

With this arrangement, since the area ratio of the unpolarized vibration regions, which are the portions of the vibration region located in the unpolarized sections, of the first filter element is different from the area ratio of the unpolarized vibration regions of the second filter element, the energy-trapping states of the two filter elements are different from each other. Thus, frequencies at which unwanted vibrations are generated are different from each other, so that the responses of unwanted vibrations can be minimized and eliminated without unwanted vibrations of the two filter elements being superimposed. In addition, this arrangement can displace the center electrodes of the two filter elements, so that degradation of the attenuation characteristic of the piezoelectric filter is prevented.

As methods of varying the area ratios of the unpolarized vibration regions between two filter elements, for example, there are some approaches to provide filter elements having the following configurations (1) to (3):

(1) two filter elements having the same vibration regions (area, shape) and having different unpolarized sections (area, shape);

(2) two filter elements having the same unpolarized sections (area, shape) and having different vibration regions (area, shape); and (3) two filter elements having different vibration regions (area, shape) and having different unpolarized sections (area, shape).

Preferably, the split electrodes on the first filter element are preferably arranged so as to oppose each other and the opposing direction thereof is tilted at an angle $\theta_1$ with respect to an end surface of the first piezoelectric substrate. The split electrodes on the second filter element are preferably arranged so as to oppose each other and the opposing direction thereof is tilted at an angle $\theta_2$ with respect to an end surface of the second piezoelectric substrate. The angle $\theta_1$ and the angle $\theta_2$ are different from each other. That is, as the methods (2) and (3) for achieving different vibration regions, the tilt angles $\theta_1$ and $\theta_2$ in the opposing direction of the split electrodes are configured to be different from each other. The different tilt angles $\theta_1$ and $\theta_2$ provide different frequencies at which the unwanted vibrations are generated from the two filter elements, and combining the different frequencies can reduce the unwanted vibrations. In this case, the unpolarized sections may or may not be the same.

Preferably, the first piezoelectric substrate and the second piezoelectric substrate have substantially the same outer shape, and the area occupied by the unpolarized section in the first piezoelectric substrate and the area occupied by the unpolarized section in the second piezoelectric substrate are different from each other. This arrangement uses the methods (1) and (3). Due to the two different unpolarized areas, energy-trapping states of the two filter elements are different from each other, which can suppress unwanted vibrations.

Other features, characteristics, elements and advantages of the present invention will become more apparent from the following detailed description of preferred embodiments thereof with reference to the attached drawings.

DETAILED DESCRIPTION OF PREFERRED EMBODIMENTS

Figure 1:
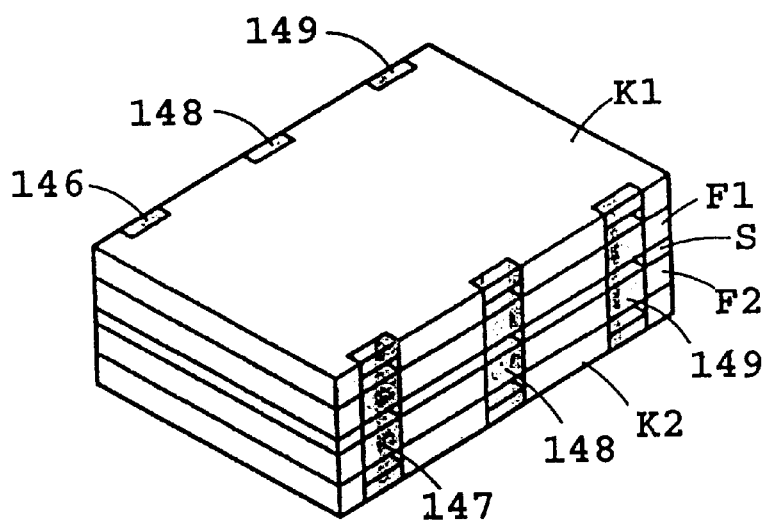
FIG. 1 is a perspective view of a piezoelectric filter according to a preferred embodiment of the present invention.

A piezoelectric filter according to a preferred embodiment of the present invention will now be described with reference to FIGS. 1 to 5. As shown in FIG. 1, this piezoelectric filter is preferably configured as a chip-type (a surface-mounted type). The piezoelectric filter preferably includes first and second dual-mode filter elements F1 and F2, a frame-like and sheet-like adhesive layer S which bonds the filter elements F1 and F2 together, and first and second casing substrates K1 and K2 which are respectively stacked on and bonded to the outer surfaces of the filter elements F1 and F2.

Figure 3A:
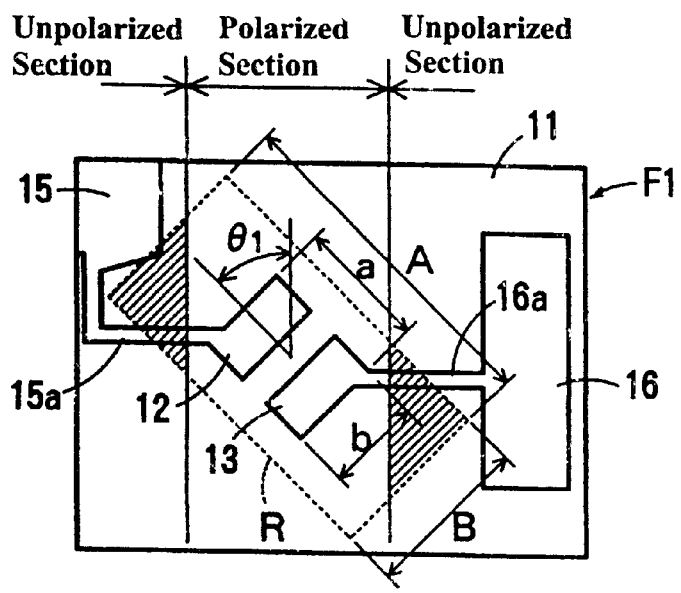
FIGS. 3A and 3B are views illustrating first and second major surfaces, respectively, of a first filter element of the piezoelectric filter of FIG. 1.
Figure 3B:
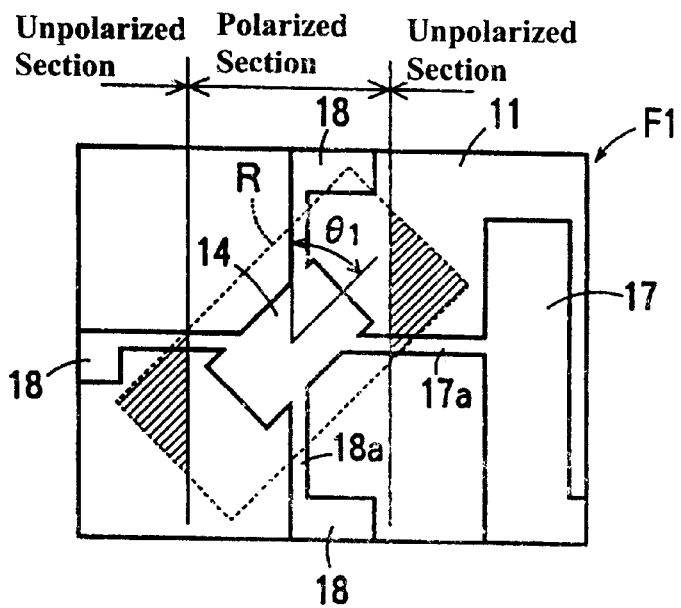

Referring to FIGS. 3A and 3B, the first filter element F1 preferably has a substantially rectangular-plate piezoelectric substrate 11 made of piezoelectric ceramic or piezoelectric single crystal, or other suitable material. On a first major surface of the piezoelectric substrate 11, split electrodes 12 and 13 are disposed a predetermined distance apart from each other. A common electrode 14 which faces the split electrodes 12 and 13 is disposed on a second major surface of the piezoelectric substrate 11. These electrodes 12, 13, and 14 constitute an energy-trapping dual-mode filter utilizing thickness extensional vibration. The split electrodes 12 and 13 oppose each other and the opposing direction thereof is preferably tilted at an angle $\theta_1$ with respect to an end surface of the piezoelectric substrate 11, and the tilt angle $\theta_1$ in this case is preferably about 45°. The split electrode 12 is connected to an input terminal electrode 15 located at one corner of the piezoelectric substrate 11 through a narrow lead electrode 15a. On the other hand, the split electrode 13 is connected to a relay terminal electrode 16, which is located at the side that is spaced away from the terminal electrode 15, through a narrow lead electrode 16a. The relay terminal electrode 16 also functions as a capacitance electrode. The common electrode 14 is connected to a capacitance electrode 17, which is arranged so as to face the terminal electrode 16, through a narrow lead electrode 17a. A relay capacitance C1 is defined between the relay terminal electrode 16 and the capacitance electrode 17. Besides the capacitance electrode 17, a plurality of ground terminal electrodes 18 are provided at three edges of the second major surface of the piezoelectric substrate 11, and are connected with the common electrode 14 through narrow lead electrodes 18a.

As shown in FIGS. 3A and 3B, the piezoelectric substrate 11 of the first filter element F1 is polarized only at the center section thereof, while sections located near both ends of the piezoelectric substrate 11 are not polarized, to provide unpolarized sections within which the terminal electrodes 15 and 16 and the capacitance electrode 17 are arranged. Energy trapping vibration of the first filter element F1 is generated in a vibration region R1 indicated by the broken lines in FIGS. 3A and 3B. As shown, the electrodes 12 to 14 are encompassed within the vibration region R1, and portions of vibration region R1 are located in the unpolarized sections indicated by hatching. The vibration region R1 is not limited in shape to a rectangle as indicated by the broken lines. However, the length A, in the direction in which the split electrodes 12 and 13 oppose each other, is preferably greater than the distance a between the farther ends of the split electrodes 12 and 13 by a factor of about 3 to about 4, and the width B is preferably greater than the width b of the split electrode 12 and 13 by a factor of about 1.5 to about 2. Since the terminal electrodes 15 and 16 are arranged in the unpolarized sections as described above, this arrangement can suppress unwanted vibration and thus can provide a piezoelectric filter with greatly improved filter characteristics.

Referring to FIG. 4, the second filter element F2 preferably has a substantially rectangular-plate piezoelectric substrate 21 made of piezoelectric ceramic or piezoelectric single crystal, or other suitable material. On a second major surface of the piezoelectric substrate 21, split electrodes 22 and 23 are disposed a predetermined distance apart from each other. A common electrode 24 that opposes the split electrodes 22 and 23 is disposed on the second major surface of the piezoelectric substrate 21. As in the first filter element F1, the electrodes 22, 23, and 24 constitute an energy-trapping dual-mode filter utilizing thickness expander mode vibration. The center frequencies of the first filter element F1 and the second filter element F2 preferably have substantially the same value (in this case, about 10.7 MHz). The split electrodes 22 and 23 oppose each other and the opposing direction thereof is tilted at an angle $\theta_2$ with respect to an end surface of the piezoelectric substrate 21, where the angle $\theta_2$ is preferably a value that is different from $\theta_1$ and in this case is about 25°. The split electrode 22 is connected to an output terminal electrode 25 located at one corner of the piezoelectric substrate 21 through a narrow lead electrode 25a. On the other hand, the split electrode 23 is connected to a relay terminal electrode 26, which is located at the side spaced away from the terminal electrode 25 on the piezoelectric substrate 21, through a narrow lead electrode 26a. The relay terminal electrode 26 also functions as a capacitance electrode. The relay terminal electrode 26 of the filter element F2 is arranged at a position corresponding to the relay terminal electrode 16 of the filter element F1 in the thickness direction. The common electrode 24 is connected to a capacitance electrode 27, which is arranged so as to face the relay terminal electrode 26, through a narrow lead electrode 27a. A relay capacitance C2 is defined between the relay terminal electrode 26 and the capacitance electrode 27. Besides the capacitance electrode 27, a plurality of ground terminal electrodes 28 are provided at three edges of the first major surface of the piezoelectric substrate 21, and are connected with the common electrode 24 through narrow lead electrodes 28a. The terminal electrode 28 of the filter element F2 is arranged at a position corresponding to the terminal electrode 18 of the filter element F1 in the thickness direction.

Figure 4A:
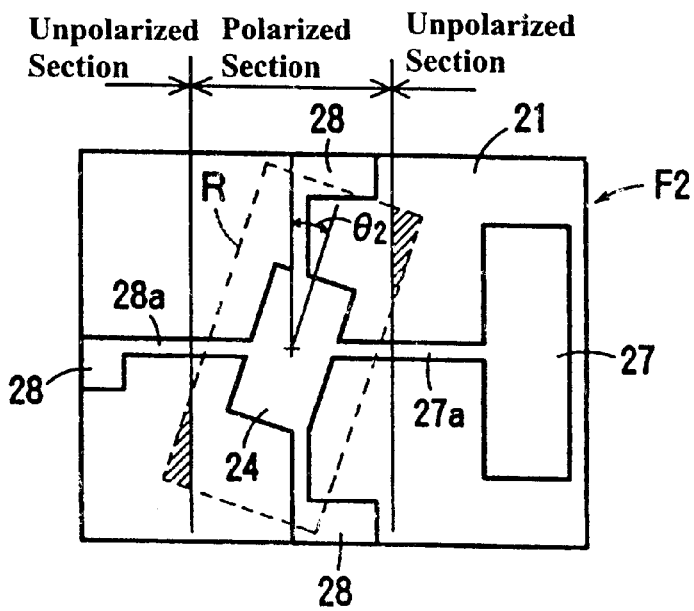
FIGS. 4A and 4B are views illustrating first and second major surfaces, respectively, of a second filter element of the piezoelectric filter of FIG. 1.
Figure 4B:
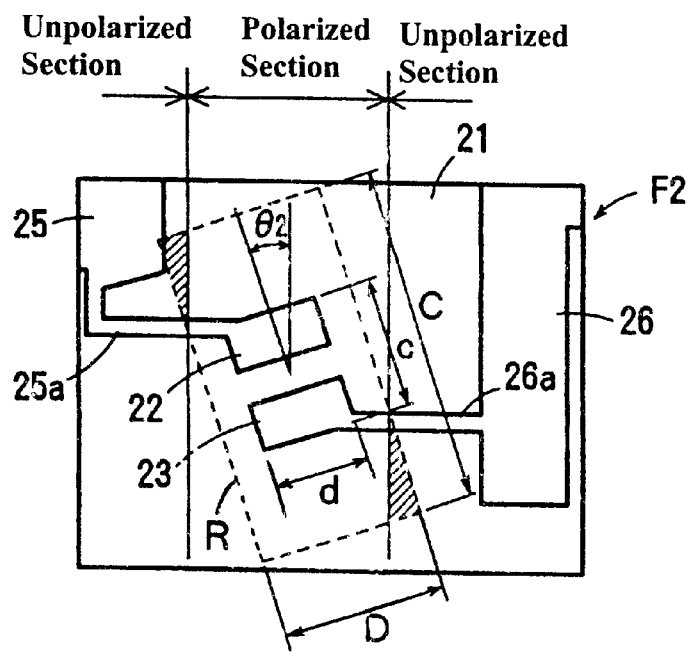

Referring to FIGS. 4A and 4B, the piezoelectric substrate 21 of the second filter element F2 is polarized at only the center thereof, while sections located near both ends of the piezoelectric substrate 21 are not polarized, to provide unpolarized sections within which the terminal electrodes 25 and 26 and the capacitance electrode 27 are arranged. Energy-trapping vibration of the second filter element F2 is generated in a vibration region R2 indicated by the broken lines in FIGS. 4A and 4B. As shown, the electrodes 22 to 24 are encompassed within the vibration region R2, and portions of vibration region R2 are located in the unpolarized sections indicated by hatching. The length C of the vibration region R2, in the direction in which the split electrodes 22 and 23 oppose each other, is preferably greater than the distance c between the farther ends of the split electrodes 22 and 23 by a factor of about 3 to about 4, and the width D is preferably greater than the width d of the split electrode 22 and 23 by a factor of about 1.5 to about 2. Since the terminal electrodes 25 and 26 are arranged in the unpolarized sections as in the same manner as the filter element F1, this arrangement can also suppress unwanted vibration and thus can provide a piezoelectric filter with greatly improved filter characteristics.

Figure 2:
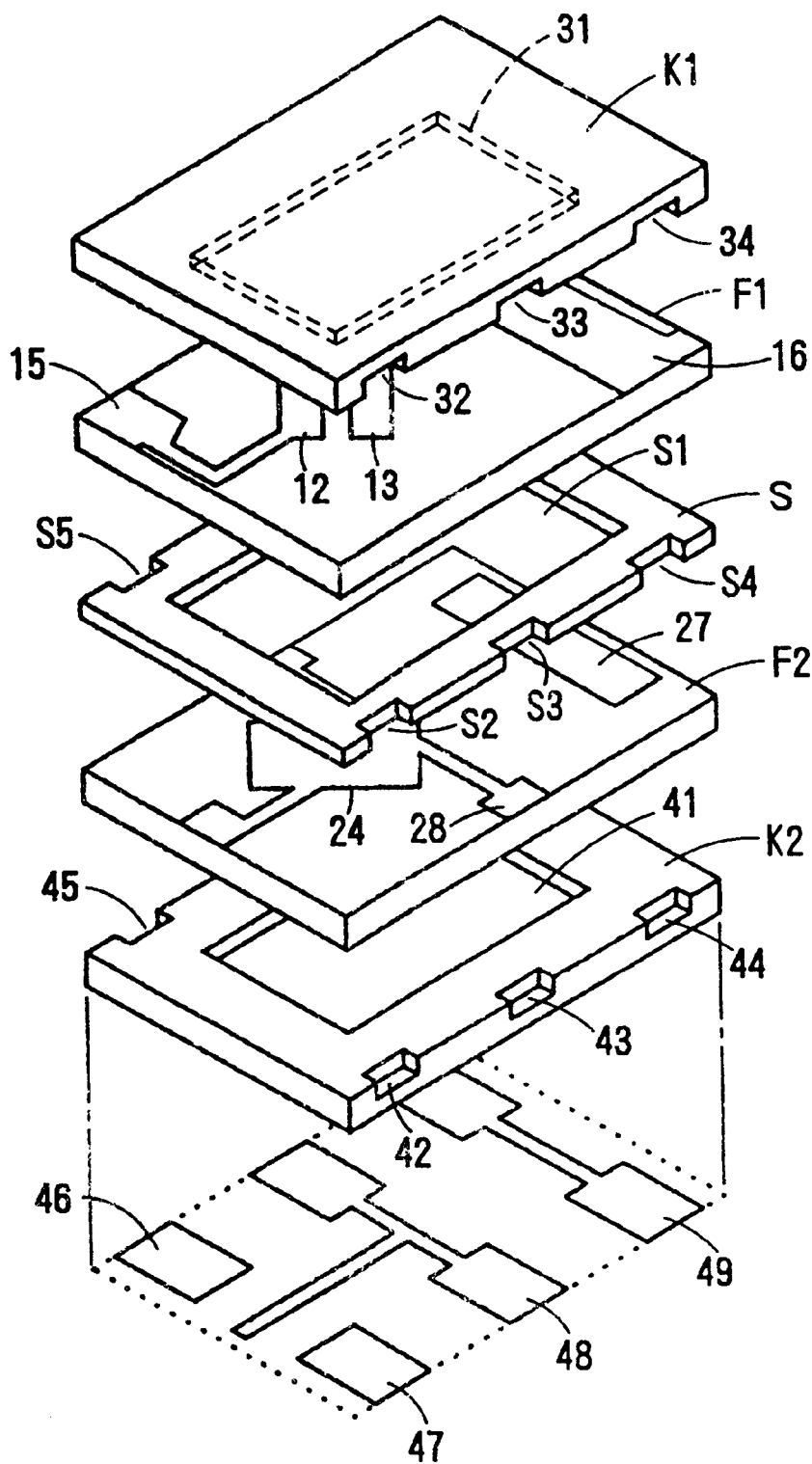
FIG. 2 is an exploded perspective view of the piezoelectric filter of FIG. 1.

Referring to FIG. 2, the two filter elements F1 and F2 are stacked with the frame-like and sheet-like adhesive layer S interposed therebetween and bonded together, such that an opening S1 of the adhesive layer S provides a vibration space between the filter elements F1 and F2. The adhesive layer S preferably has six notches S2 to S7 (S6 and S7 are not shown) at both longitudinal edges thereof, such that they correspond to recesses 32 to 37 and 42, 43, 44, 45, 46 and 47 (35 to 37 and 46 and 47 are not shown) of the casing substrates K1 and K2.

The first casing substrate K1 to be bonded to the first major surface of the first filter element F1 preferably includes an insulating member having no piezoelectricity, such as ceramic or a heat-resisting resin member. The first casing substrate K1 has a depression 31 formed in the inner surface, i.e., the second major surface thereof to define the vibration space. The six recesses 32 to 37, as previously mentioned, for providing an electrode material are formed in the second major surface along both longitudinal edges of the casing substrate K1 so as to correspond to the respective terminals electrodes of filter elements F1 and F2.

Similarly, the second casing substrate K2 preferably includes an insulating member having no piezoelectricity, and has a depression 41 formed in the inner surface, i.e., the first major surface thereof to define the vibration space. The six recesses 42 to 47 for providing an electrode material are formed in the first major surface along both longitudinal edges of the casing substrate K2 so as to correspond to the respective terminals electrodes of filter elements F1 and F2.

Figure 5:
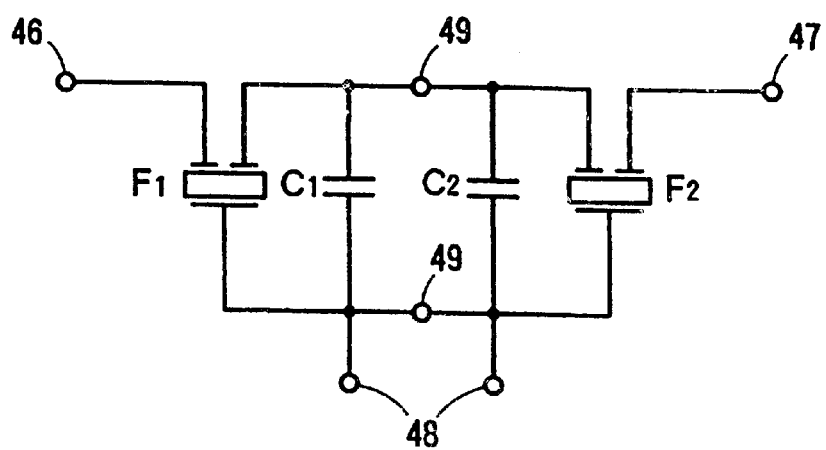
FIG. 5 is a circuit diagram of the piezoelectric filter of FIG. 1.

An input external electrode 46, an output external electrode 47, a ground external electrode 48, and a relay external electrode 49 are disposed, as shown on a projected plane in FIG. 2, on the second major surface of the casing substrate K2. The external electrodes 46 to 49 are connected to strip electrodes 146, 147, 148, and 149 (refer to FIG. 1) successively arranged at both longitudinal edges in the thickness direction of the piezoelectric filter. Through the strip electrodes 146, 147, 148, and 149, the input electrode 15 of the first filter element F1 is connected to the input external electrode 46, and the output terminal electrode 25 of the second filter element F2 is connected to the output external electrode 47. Further, the relay terminal electrodes 16 and 26 of the first and second filter elements F1 and F2 are connected to the relay external electrode 48, and the ground terminal electrodes 18 and 28 are connected to the ground external electrode 49. The recesses 32 to 37 and 42 to 47 of the casing substrate K1 and K2, and the notches S2 to S7 of the adhesive layer S are utilized so that an electrode material are applied to larger areas of the respective terminal electrodes 15, 16, 17, 25, 26, and 28. This improves the reliability of the conduction between the external electrode 46 to 49 and the corresponding terminal electrodes 15, 16, 18, 25, 26, and 28 of the filter elements F1 and F2. In this case, a conductive paste is preferably used as the electrode material. Thus, it is intended that the recesses 32 to 37 and 42 to 47 of the casing substrate K1 and K2, and the notches S2 to S7 of the adhesive layer S greatly improve the reliability of conductance between the external electrodes 46 to 49 and the corresponding terminal electrodes 15, 16, 18, 25, 26, and 28 of the filter elements F1 and F2. If, however, the conductance therebetween can be secured, the recesses 32 to 37 and 42 to 47 and the notches S2 to S7 may be eliminated. FIG. 5 is a circuit diagram of the piezoelectric filter in which the two filter elements F1 and F2 are connected, as described above, in a face-to-face arrangement with the relay capacitances C1 and C2 therebetween.

As indicated by hatching in FIGS. 3A, 3B, 4A, and 4B, the ratio of the area of the portions of the vibration region R1 which are located in the unpolarized sections of the first filter element to the area of the entire vibration region R1 is different from the ratio of the area of the portions of the vibration region R2 which are located in the unpolarized sections of the second filter element to the area of the entire vibration region R2. Specifically, in the first filter element F1, the area ratio of the portions of the vibration region R1 which are located in the unpolarized sections is about 30%, whereas in the second filter element F2, the area ratio is about 10%. Thus, the different ratios between the areas of the unpolarized vibration regions causes a variation between the energy-trapping state of the two filter elements F1 and F2, so that the frequencies at which unwanted vibrations are generated from the vibrations regions R1 and R2 are different from each other. As a result, responses of unwanted vibration can be reduced without unwanted vibrations of the two filter elements F1 and F2 being superimposed. In addition, this arrangement can eliminate the need for displacing the center electrodes of the two filter elements F1 and F2, so that degradation of the attenuation characteristic of the piezoelectric filter is prevented.

Figure 6:
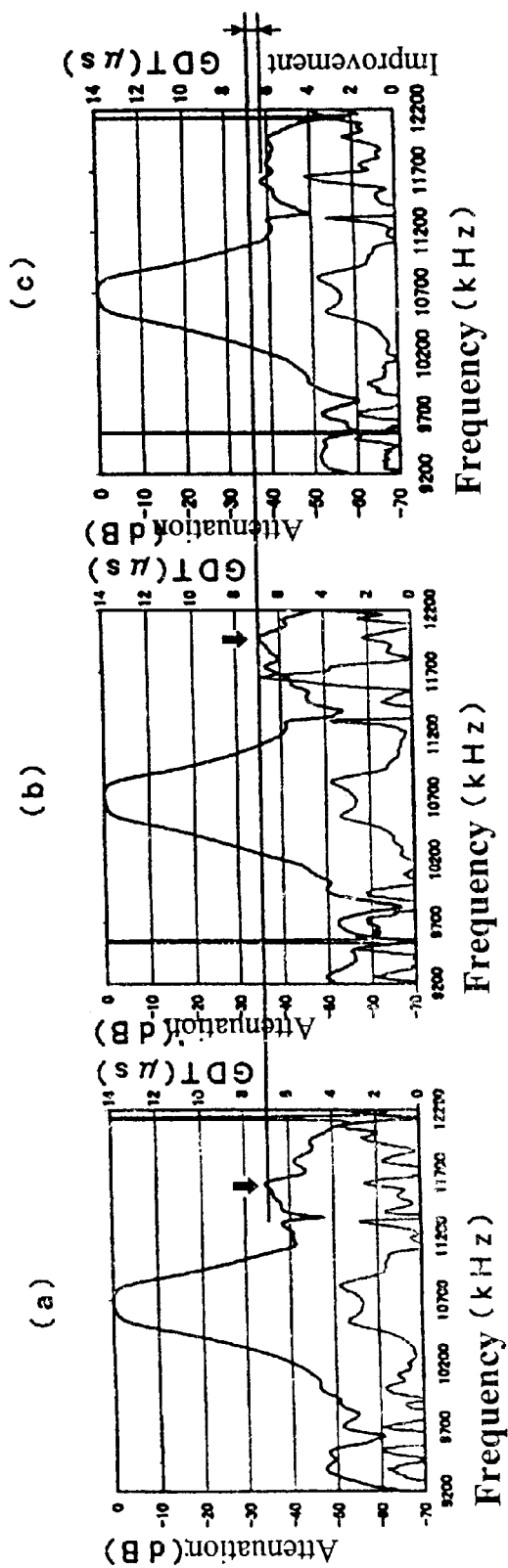
FIG. 6 illustrates three graphs each showing the attenuation characteristic and group delay characteristic of the piezoelectric filter with a different area ratio of unpolarized sections occupying the vibration region.

FIG. 6 illustrates three graphs (a), (b), and (c) showing attenuation characteristics and group delay characteristics when the area ratios of the unpolarized vibration regions are varied. That is, in graph (a) of FIG. 6, both the area ratios of the unpolarized vibration regions in the first and second filter elements F1 and F2 are about 10%, and in graph (b) of FIG. 6, both the area ratios are about 30%. In graph (c) of FIG. 6 in which the values of the piezoelectric filter according to preferred embodiments of the present invention are shown, the area ratio of one of the filter elements is about 10% and the other is about 30%, for example. As is apparent from FIG. 6, in each of the cases of (a) and (b), spurious responses of about −35 dB are generated at frequencies higher than the center frequency, whereas in the case of (c), such spurious responses are minimized.

In the preferred embodiment of the present invention described above, the piezoelectric substrates having substantially the same outer shape and the same unpolarized area are preferably used, and the tilt angles $\theta_1$ and $\theta_2$ of the vibration electrodes, i.e., the tilt angle $\theta_1$ of the electrodes 12, 13, and 14, and the tilt angle $\theta_2$ of the electrodes 22, 23, and 24 are changed so as to vary the area ratios between the unpolarized vibration regions in the two filter elements.

The present invention, however, is not limited to preferred embodiments described herein. For example, as shown in Japanese Unexamined Patent Application Publication No. 10-284985, the opposing directions of the split electrodes of both the filter elements may be substantially parallel or substantially perpendicular to an end surface of the piezoelectric substrates, such that unpolarized sections are changed to provide different area ratios for unpolarized vibration regions to each other.

While preferred embodiments described above use filter elements vibrating in a thickness extensional vibration mode, the present invention is not limited thereto. For example, filter elements vibrating in other modes of vibration, such as thickness shear mode of vibration, can also be used. In addition, it is not only intended that the present invention provides a chip-type piezoelectric filter in which filter elements and casing substrates are stacked, but is also be applicable to a piezoelectric filter having a structure in which two filter elements are mounted on a casing substrate and a cap is mounted thereon so as to seal the filter elements.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A piezoelectric filter comprising:
    a first energy-trapping dual-mode filter element including:
        a first piezoelectric substrate having first and second major surfaces;
        split electrodes provided on the first major surface;
        a common electrode which is provided on the second major surface and which faces the split electrodes; and
        terminal electrodes provided at or adjacent to edges of both of the first and the second major surfaces of the first piezoelectric substrate, each of the terminal electrodes being connected with one of the split electrodes and the common electrode; and
    a second energy-trapping dual-mode filter element including:
        a second piezoelectric substrate having first and second major surfaces;
        split electrodes provided on the first major surface;
        a common electrode which is provided on the second major surface and which faces the split electrodes; and
        terminal electrodes provided at or adjacent to edges of both the first and the second major surfaces, each of the terminal electrodes being connected with one of the split electrodes and the common electrode;
    wherein one of the split electrodes of said first filter element is interconnected with one of the split electrodes of said second filter element,
    wherein unpolarized sections are provided at edges of each of the first and second piezoelectric substrates, and said first and second filter elements each have a vibration region in which the energy-trapping vibration is generated, portions of each vibration region being located in the unpolarized sections, and
    wherein a ratio of the area of the portions of the vibration region which are located in the unpolarized sections of said first filter element to the area of the entire vibration region of said first filter element is different from a ratio of the area of the portions of the vibration region which are located in the unpolarized sections of said second filter element to the area of the entire vibration region of said second filter element.

2. A piezoelectric filter according to claim 1, wherein the split electrodes on said first filter element oppose each other and the opposing direction thereof is tilted at an angle $\theta_1$ with respect to an end surface of the first piezoelectric substrate, and the split electrodes on said second filter element oppose each other and the opposing direction thereof is tilted at an angle $\theta_2$ with respect to an end surface of the second piezoelectric substrate, the angle $\theta_1$ and the angle $\theta_2$ being different from each other.

3. A piezoelectric filter according to claim 1, wherein the first piezoelectric substrate and the second piezoelectric substrate have substantially the same outer shape, and the area occupied by the unpolarized sections in the first piezoelectric substrate and the area occupied by the unpolarized sections in the second piezoelectric substrate are different from each other.

4. A piezoelectric filter according to claim 1, wherein the piezoelectric filter is a chip-type, surface-mount type component.

5. A piezoelectric filter according to claim 1, wherein the first and second energy-trapping dual-mode filter elements are stacked on each other and joined to each other.

6. A piezoelectric filter according to claim 1, further comprising at least one of a frame-like adhesive layer and a sheet-like adhesive layer arranged to bond the first and second energy-trapping dual-mode filter elements to each other.

7. A piezoelectric filter according to claim 1, wherein the first piezoelectric substrate and the second piezoelectric substrate are made of one of a piezoelectric ceramic and a piezoelectric single crystal.

8. A piezoelectric filter according to claim 1, wherein the split electrodes and common electrodes of the first and second energy-trapping dual-mode filter elements define an energy-trapping dual-mode filter utilizing thickness extensional vibration.

9. A piezoelectric filter according to claim 1, wherein the angle $\theta_1$ is about 45 degrees and the angle $\theta_2$ is about 25 degrees.

10. A piezoelectric filter according to claim 1, wherein the center frequencies of the first and second energy-trapping dual-mode filter elements have substantially the same value.

11. A piezoelectric filter comprising:
a first filter element including:
   a first substrate having first and second major surfaces;
   split electrodes provided on the first major surface;
   a common electrode which is provided on the second major surface and which faces the split electrodes; and
   terminal electrodes provided at or adjacent to edges of both of the first and the second major surfaces of the first piezoelectric substrate, each of the terminal electrodes being connected with one of the split electrodes and the common electrode; and
a second filter element including:
   a second substrate having first and second major surfaces;
   split electrodes provided on the first major surface;
   a common electrode which is provided on the second major surface and which faces the split electrodes; and
   terminal electrodes provided at or adjacent to edges of both the first and the second major surfaces, each of the terminal electrodes being connected with one of the split electrodes and the common electrode;
wherein one of the split electrodes of said first filter element is interconnected with one of the split electrodes of said second filter element,
wherein unpolarized sections are provided at edges of each of the first and second substrates, and said first and second filter elements each have a vibration region in which the energy-trapping vibration is generated, portions of each vibration region being located in the unpolarized sections, and
wherein a ratio of the area of the portions of the vibration region which are located in the unpolarized sections of said first filter element to the area of the entire vibration region of said first filter element is different from a ratio of the area of the portions of the vibration region which are located in the unpolarized sections of said second filter element to the area of the entire vibration region of said second filter element.

12. A piezoelectric filter according to claim 11, wherein the first and second substrates are piezoelectric substrates made of one of a piezoelectric ceramic and a piezoelectric single crystal.

13. A piezoelectric filter according to claim 11, wherein the split electrodes on said first filter element oppose each other and the opposing direction thereof is tilted at an angle $\theta_1$ with respect to an end surface of the first substrate, and the split electrodes on said second filter element oppose each other and the opposing direction thereof is tilted at an angle $\theta_2$ with respect to an end surface of the second substrate, the angle $\theta_1$ and the angle $\theta_2$ being different from each other.

14. A piezoelectric filter according to claim 11, wherein the first substrate and the second substrate have substantially the same outer shape, and the area occupied by the unpolarized sections in the first substrate and the area occupied by the unpolarized sections in the second substrate are different from each other.

15. A piezoelectric filter according to claim 11, wherein the piezoelectric filter is a chip-type, surface-mount type component.

16. A piezoelectric filter according to claim 11, wherein the first and second filter elements are energy-trapping dual-mode filter elements and are stacked on each other and joined to each other.

17. A piezoelectric filter according to claim 11, further comprising at least one of a frame-like adhesive layer and a sheet-like adhesive layer arranged to bond the first and second energy-trapping dual-mode filter elements to each other.

18. A piezoelectric filter according to claim 11, wherein the split electrodes and common electrodes of the first and second filter elements define an energy-trapping dual-mode filter utilizing thickness extensional vibration.

19. A piezoelectric filter according to claim 11, wherein the angle $\theta_1$ is about 45 degrees and the angle $\theta_2$ is about 25 degrees.

20. A piezoelectric filter according to claim 11, wherein the center frequencies of the first and second filter elements have substantially the same value.

* * * * *